(12) United States Patent
Tanaka et al.

(10) Patent No.: US 9,162,320 B2
(45) Date of Patent: Oct. 20, 2015

(54) BONDING DEVICE

(71) Applicants: Eiji Tanaka, Kanazawa (JP); Hiroyuki Yasuyoshi, Kanazawa (JP)

(72) Inventors: Eiji Tanaka, Kanazawa (JP); Hiroyuki Yasuyoshi, Kanazawa (JP)

(73) Assignee: SHIBUYA KOGYO CO., LTD., Kanazawa-shi, Ishikawa (JP)

( * ) Notice: Subject to any disclaimer, the term of this patent is extended or adjusted under 35 U.S.C. 154(b) by 363 days.

(21) Appl. No.: 13/911,644

(22) Filed: Jun. 6, 2013

(65) Prior Publication Data

US 2014/0001163 A1    Jan. 2, 2014

(30) Foreign Application Priority Data

Jun. 29, 2012  (JP) ................. 2012-147083

(51) Int. Cl.

| | |
|---|---|
| *B23K 1/00* | (2006.01) |
| *B23K 26/00* | (2014.01) |
| *B23K 26/20* | (2014.01) |
| *B23K 26/22* | (2006.01) |
| *H01L 23/00* | (2006.01) |
| *H01L 21/58* | (2006.01) |
| *H01L 21/60* | (2006.01) |

(52) U.S. Cl.
CPC . *B23K 26/22* (2013.01); *B23K 1/00* (2013.01); *B23K 26/00* (2013.01); *H01L 24/75* (2013.01); *B23K 26/20* (2013.01); *H01L 21/58* (2013.01); *H01L 24/81* (2013.01); *H01L 2021/6003* (2013.01); *H01L 2021/60112* (2013.01); *H01L 2224/131* (2013.01); *H01L 2224/16227* (2013.01); *H01L 2224/75262* (2013.01); *H01L 2224/75702* (2013.01); *H01L 2224/75745* (2013.01); *H01L 2224/81024* (2013.01); *H01L 2224/81224* (2013.01)

(58) Field of Classification Search
CPC ............ H01L 21/58; H01L 2021/6003; H01L 2021/60112; H01L 2021/60; B23K 26/00; B23K 26/20
USPC ........ 219/121.63–121.66; 228/179.1, 180.21, 228/180.22, 44.3, 44.7, 49.5; 156/272.8, 156/379.6–379.8, 580
See application file for complete search history.

(56) References Cited

U.S. PATENT DOCUMENTS

| | | | | |
|---|---|---|---|---|
| 5,042,709 | A | * | 8/1991 | Cina et al. ..................... 228/105 |
| 8,168,920 | B2 | * | 5/2012 | Terada et al. ............ 219/121.65 |
| 2008/0268571 | A1 | * | 10/2008 | Kim ............................. 438/108 |

FOREIGN PATENT DOCUMENTS

| | | |
|---|---|---|
| JP | 2009-182162 | 8/2009 |
| JP | 2010-129890 | 6/2010 |

* cited by examiner

*Primary Examiner* — Samuel M Heinrich
(74) *Attorney, Agent, or Firm* — Flynn, Thiel, Boutell & Tanis, P.C.

(57) ABSTRACT

A chip attraction passage 23 is provided extending through a housing 5A, a tool base 13, and a bonding tool 14. When the chip attraction passage 23 is attracted by the vacuum source 32, a semiconductor chip 3 can be attracted to and held on the lower surface of the bonding tool 14. The tool base 13 is configured by laminating transmitting members 11 and 12. A connection passage 29, which is a main part of the chip attraction passage 23, is configured by a groove 12B formed on the upper surface of the transmitting member 12 and a through-hole 12A in the center of the transmitting member 12. When the semiconductor chip 3 is heated by laser beams L and bonded to a substrate 2, even if flux or the like adhering to bumps 35 transpires and adheres in the connection passage 29.

4 Claims, 2 Drawing Sheets

BONDING DEVICE

FIELD OF THE INVENTION

The present invention relates to a bonding device and, more particularly, to a bonding device configured to heat a semiconductor chip with a laser beam and bond the semiconductor chip to a substrate.

DESCRIPTION OF THE PRIOR ART

Conventionally, there has been publicly known a bonding device configured to heat, with a laser beam, a bonding tool held by a bonding head and heat a semiconductor and bond the semiconductor to a substrate using the bonding tool (e.g., Japanese Patent Laid-Open No. 2010-129890 and Japanese Patent Laid-Open No. 2009-182162).

In such a conventional bonding device, when a tool attraction passage formed in a housing of the bonding head communicates with an attraction device, the housing is attracted by an attraction device. Therefore, a semiconductor chip can be attracted to and held on the lower surface of the bonding tool.

Incidentally, when bonding operation is performed by the conventional bonding device, liquid flux or the like is used and applied to bumps. However, when the flux or the like is used when a semiconductor chip is bonded, a problem explained below occurs. The flux or the like transpires because of heat when the semiconductor chip is heated and the bumps are melted, the transpired flux or the like is attracted into the housing through the through-hole of the bonding tool and adheres to the inner surface of the housing. Therefore, while bonding operation for the semiconductor chip is repeated by the bonding device, the flux or the like adheres to the surfaces of a condensing lens in the housing and a transmitting member that transmits a laser beam. The adhered flux or the like blocks the transmission of the laser beam. Therefore, heating efficiency in heating the bonding tool with the laser beam is deteriorated.

SUMMARY OF THE INVENTION

In view of the above-mentioned circumstances, the present invention described in claim 1 is a bonding device including: a substrate stage on which a substrate is placed; a laser resonator configured to oscillate a laser beam; a bonding head configured to hold an electronic component and bond the electronic component to the substrate; light guiding means for guiding the laser beam oscillated from the laser resonator to the bonding head; a tool base provided in the bonding head and configured to transmit the laser beam; and an attraction passage for the electronic component provided on the tool base, the bonding device heating the electronic component with the laser beam transmitted through the tool base and bonding the electronic component to the substrate, characterized in that the light guiding means guides a plurality of laser beams respectively having different light guide paths to the bonding head and transmits the laser beams through the tool base and the attraction passage for the electronic component has a section crossing an irradiating direction of the respective laser beams, the crossing section being arranged between the light guide paths of the respective laser beams.

The present invention described in claim 2 is characterized in that, in the configuration of claim 1, the light guiding means guides the respective laser beams to form a plurality of irradiation spots arrayed in a pattern of a matrix shape on an end face of the tool base.

The present invention described in claim 3 is characterized in that, in the configuration of claim 1 or claim 2, a beam profile of each of the respective laser beams guided to the bonding head by the light guiding means is in a Gaussian mode.

The present invention described in claim 4 is characterized in that, in the any one of the configurations of claims 1 to 3, the tool base is configured by laminating a first transmitting member on an upper layer side and a second transmitting member on a lower layer side, and the attraction passage is configured by an axis direction hole formed in the second transmitting member and a groove communicating with the axis direction hole and formed in at least one of contact surfaces of the first transmitting member and the second transmitting member.

According to the configuration of claim 1, when a flux or the like is used in bonding operation by the bonding device, if the flux or the like transpires and is attracted into the attraction passage, the flux or the like adheres to the attraction passage. However, a setting area of the attraction passage is small and, moreover, the attraction passage is located among the light guide path for the laser beams. Therefore, compared with the prior art, it is possible to prevent the heating efficiency of the laser beams from being deteriorated by the transpired flux or the like. Further, since an area contaminated by the flux or the like can be limited, it is possible to improve maintainability of the bonding device.

According to the configuration of claim 2, since the irradiation spots are arrayed in the matrix shape, it is easy to arrange the attraction passage.

According to the configuration of claim 3, since the beam profile of the irradiation spots is in the Gaussian mode, a laser beam having relatively low intensity is irradiated on the attraction passage. Therefore, it is possible to suppress a fall in the transmittance of the laser beam.

Further, according to the configuration of claim 4, it is easy to manufacture the attraction passage. By separating the first transmitting member and the second transmitting member, it is possible to easily clean the attraction passage in which the flux or the like accumulates. Therefore, it is possible to improve maintainability of the attraction passage.

DETAILED DESCRIPTION OF THE EMBODIMENT

Figure 1:
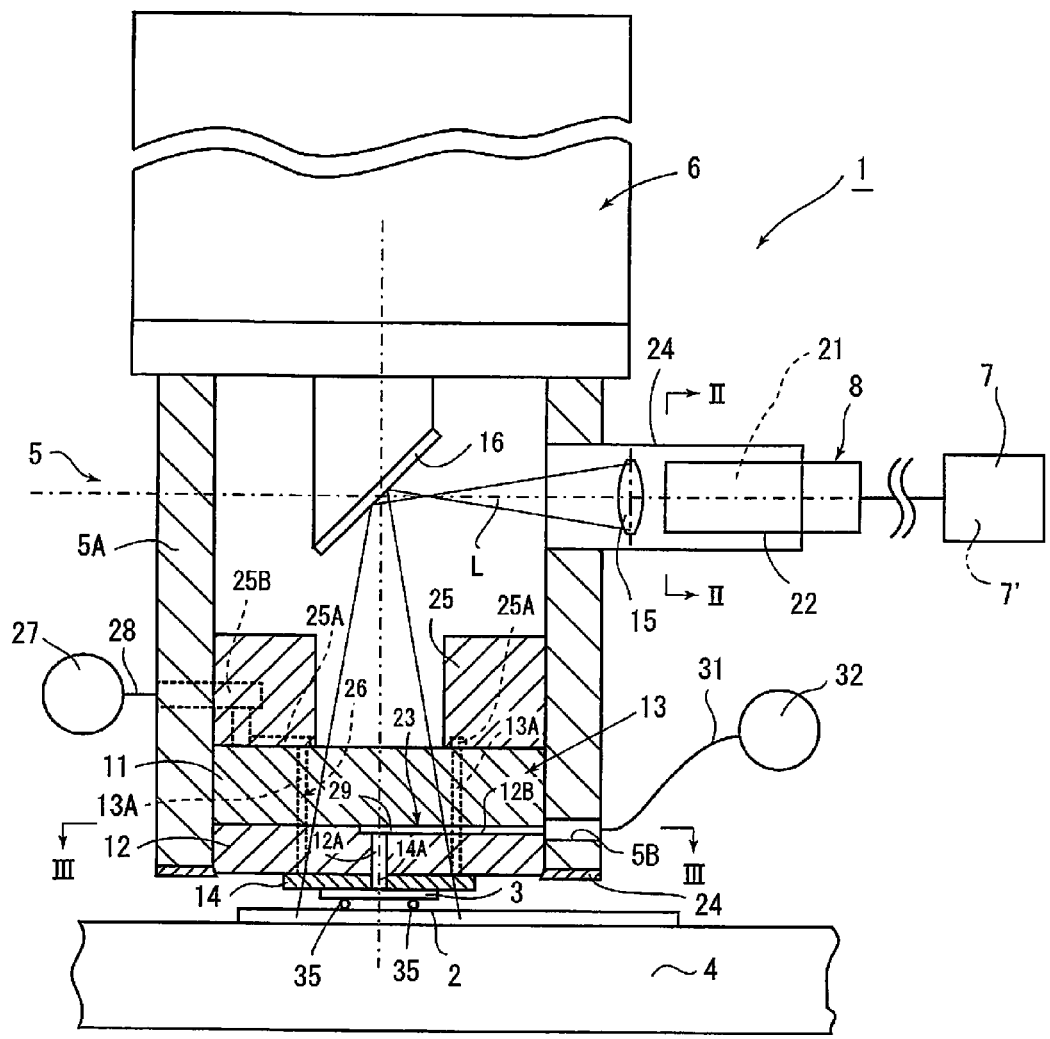
FIG. 1 is a configuration diagram showing an embodiment of the present invention.

The present invention is explained below concerning an embodiment shown in the figures. In FIG. 1, reference numeral 1 denotes a bonding device 1 that bonds a semiconductor chip 3 to a substrate 2. The bonding device 1 includes a substrate stage 4 configured to support the substrate 2 and move the substrate 2 in an X-Y direction in a horizontal plane, a bonding head 5 arranged on the upper side of the substrate stage 4, a lifting/lowering loading mechanism 6 configured to lift and lower the bonding head 5, a laser resonator 7 configured to oscillate a laser beam L, and light guiding means 8 for guiding the laser beam L oscillated from the laser resonator 7 into the bonding head 5.

As explained below in detail, the bonding head 5 includes a cylindrical housing 5A. A tool base 13 including transmitting members 11 and 12 in two layers is horizontally fixed to the lower end of the housing 5A. A bonding tool 14 can be detachably attracted to and held on the lower surface of the tool base 13. At the same time, the semiconductor chip 3 can be detachably attracted to and held on the lower surface of the bonding tool 14.

One end of the light guiding means 8 is horizontally connected to the upper part of a side surface of the housing 5A. The other end of the light guiding means 8 is connected to the laser resonator 7.

The laser beam L oscillated from the laser resonator 7 is horizontally irradiated toward the axis of the housing 5A via the light guiding means 8 and is condensed in a required size by a condensing lens 15. The laser beam L irradiated in the horizontal direction is reflected vertically downward by a reflecting mirror 16 arranged in the upper center in the housing 5A, transmitted through the tool base 13, and irradiated on the bonding tool 14 to heat the bonding tool 14. Consequently, the semiconductor chip 3 held by the bonding tool 14 is also heated.

The actuation of the substrate stage 4, the lifting/lowering loading mechanism 6, and the laser resonator 7 is controlled by a not-shown control device. When the control device actuates the laser resonator 7, the laser beam L is oscillated from the laser resonator 7. The laser beam L is guided to the bonding head 5 via the light guiding means 8 and then irradiated on the bonding tool 14 to heat the bonding tool 14. As the laser resonator 7, a solid-state laser such as a semiconductor laser or a YAG laser or other lasers can be used.

Therefore, this embodiment is characterized in that deterioration in heating efficiency in heating the bonding tool 14 with the laser beam L is prevented by configuring the laser resonator 7, the light guiding means 8, and the tool base 13 and the periphery thereof as explained below.

Figure 2:
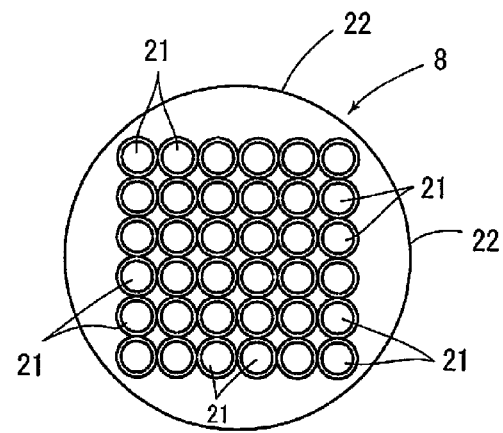
FIG. 2 is a sectional view of a main part taken along line II-II of FIG. 1.

As shown in FIGS. 1 and 2, the light guiding means 8 in this embodiment is configured by a bundle of thirty-six optical fibers 21 having the same outer diameter. Respective laser beams L passing through different light guide path for the respective optical fibers 21 are guided to the bonding head 5. The laser resonator 7 in this embodiment is configured by thirty-six laser resonators 7' controlled independently from one another and is connected to the respective optical fibers 21 corresponding to the laser resonators 7'. One end of the thirty-six optical fibers 21 (one end of the light guiding means 8) is held in a cylindrical casing 22 and is coupled to, in the horizontal state, a side surface of the housing 5A via the casing 22. The condensing lens 15 is held in the casing 22.

Figure 3:
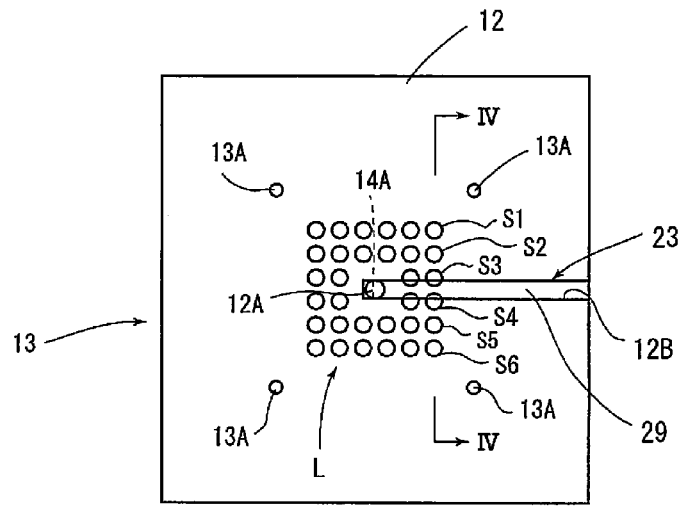
FIG. 3 is a sectional view of a main part taken along line of FIG. 1.

As shown in FIG. 2, the thirty-six optical fibers 21 configuring the light guiding means 8 are bundled in a matrix shape in which six each of the optical fibers 21 are arranged at an equal interval lengthwise and crosswise. The optical fibers 21 are held in the casing 22 in that state. Therefore, when the laser beam L is oscillated from the laser resonator 7, the laser beam L is changed to the matrix shape via the respective optical fibers 21 of the light guiding means 8, transmitted through the tool base 13, and irradiated on the bonding tool 14 (see FIG. 3). As shown in FIG. 3, irradiation spots of the respective laser beams L on the bonding tool 14 are also formed in the matrix shape.

Figure 4:
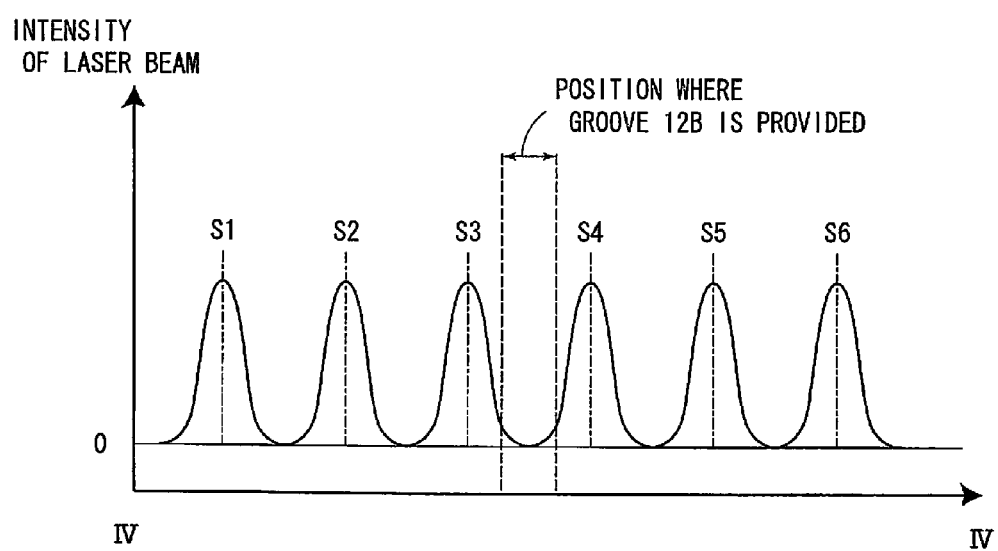
FIG. 4 is a diagram showing a profile of a laser beam taken along line IV-IV of FIG. 3.

In this embodiment, an intensity distribution (a beam profile) of the respective laser beams L is in a Gaussian mode (see S1 to S6 in FIGS. 3 and 4). In the Gaussian mode, the laser beam L in the irradiation spot has the highest intensity in a place of the optical axis of the laser beam L and the intensity of the laser beam L decreases in the periphery of the optical axis (see FIG. 4). That is, the respective laser beams L adjacent to each other have low intensity in a place between the respective laser beams L. Making use of this characteristic, in this embodiment, a chip attraction passage 23 is provided in a position between the laser beams L in adjacent rows.

Next, the configuration of the tool base 13 and the periphery of the tool base 13 is explained. The tool base 13 in this embodiment has a laminated structure including the transmitting member 11 made of sapphire as an upper layer and the transmitting member 12 made of quartz glass as a lower layer.

Both the transmitting members 11 and 12 in the laminated state are fit in an inner peripheral section at the lower end of the housing 5A. The lower surface of the transmitting member 12 is horizontally supported at substantially the same height as the lower end face of the housing 5A by an annular attaching member 24. On the other hand, the upper surface of the transmitting member 11 in the laminated state is pressed and horizontally supported by an annular stopper 25 fit in the housing 5A. Consequently, both the transmitting members 11 and 12 configuring the tool base 13 are horizontally supported in a lower part in the housing 5A. The lower surface of the transmitting member 11 and the upper surface of the transmitting member 12 are in contact with each other in a state in which air tightness is retained.

In this embodiment, a tool attraction passage 26 is formed extending through the housing 5A, the stopper 25, and the tool base 13. The chip attraction passage 23 is formed extending through the housing 5A, both the transmitting members 11 and 12, and the bonding tool 14. The tool attraction passage 26 communicates with the vacuum source 27 via a conduit 28. When the tool attraction passage 26 is attracted by the vacuum source 27, the bonding tool 14 can be attracted to and held on the lower surface of the tool base 13 (the lower surface of the transmitting member 12). The chip attraction passage 23 communicates with a vacuum source 32 via a conduit 31. When the chip attraction passage 23 is attracted by the vacuum source 32, the semiconductor chip 3 can be attracted to and held on the lower surface of the bonding tool 14 held on the tool base 13.

Through-holes 13A in four places are drilled extending through the upper and lower transmitting members 11 and 12 to match the four corners of the bonding tool 14 formed in a square shape. The upper ends of the respective through-holes 13A are communicatively connected to a groove 25A formed on the lower surface of the stopper 25. The groove 25A of the stopper 25 is connected to one end of the conduit 28 via an L-shape communication hole 25B formed extending through the stopper 25 and the housing 5A. The tool attraction passage 26 is configured by the through-holes 13A in the four places, the groove 25A of the stopper 25, and the communication hole 25B.

The other end of the conduit 28 is connected to the vacuum source 27. The actuation of the vacuum source 27 is controlled by the control device. When bonding operation is performed by the bonding device 1, the vacuum source 27 is actuated by the control device. Therefore, during the bonding operation, since negative pressure is supplied to the tool attraction passage 26, the bonding tool 14 is attracted to and held on the lower surface of the tool base 13 (the lower surface of the transmitting member 12).

Next, the chip attraction passage 23 is explained on the basis of FIGS. 1 and 3. A through-hole 12A in the up down direction is drilled in the center of the transmitting member 12 in the lower layer. Further, a linear groove 12B reaching the inner surface of the housing 5A is formed on the upper surface of the transmitting member 12 continuously from the upper end of the through-hole 12A. A through-hole 5B in the horizontal direction is drilled in the housing 5A to match a position at the outer end of the groove 12B. One end of the conduit 31 is connected to the through-hole 5B.

The linear groove 12B is formed on the upper surface of the transmitting member 12 to be located between adjacent two rows of the irradiation spots of the optical fibers 21 explained above (see FIG. 3). The entire area of the linear groove 12B is covered by the lower surface of the transmitting member 11. Therefore, the inner space of the linear groove 12B is formed as a horizontal direction hole extending outward from the center. A connection passage 29 is formed in the tool base 13 by the axis direction hole 12A and the inner space of the groove 12B formed in the transmitting member 12. That is, in the chip attraction passage 23, the connection passage 29 is a section crossing the irradiating direction of the respective laser beams L irradiated from the respective optical fibers 21.

On the other hand, a through-hole 14A in the up down direction is drilled in the center of the bonding tool 14. When the bonding tool 14 is attracted to and held on the lower surface of the tool base 13, the through-hole 14A of the bonding tool 14 and the through-hole 12A of the tool base 13 communicate with each other (the state shown in FIG. 1). In this embodiment, the chip attraction passage 23 is configured by the axis direction hole 14A of the bonding tool 14, the connection passage 29, and the through-hole 5B of the housing 5A.

One end of the conduit 31 is connected to the through-hole 5B of the housing 5A. The other end of the conduit 31 is connected to the vacuum source 32. The actuation of the vacuum source 32 is controlled by the control device. As the chip attraction passage 23 and the vacuum source 32 are communicated by the control device when required, the chip attraction passage 23 is attracted by the vacuum source 32. Consequently, the semiconductor chip 3 can be attracted to and held on the lower surface of the bonding tool 14.

In the configuration explained above, the tool attraction passage 26 is attracted by the control device via the vacuum source 27 during the start of the bonding operation. Therefore, the bonding tool 14 is attracted to and held on the lower surface of the tool base 13. The chip attraction passage 23 is attracted via the vacuum source 32 by the control device. Therefore, the semiconductor chip 3 is attracted to and held on the lower surface of the bonding tool 14.

Thereafter, in a state in which the control device actuates the substrate stage 4 to align the semiconductor chip 3 held by the bonding tool 14 and the substrate 2, the control device causes the lifting/lowering loading mechanism 6 to lower the bonding head 5. Consequently, the semiconductor chip 3 attracted to and held by the bonding tool 14 is brought into contact with and pressed against the substrate 2. From this point in time, the control device actuates the laser resonator 7, whereby the laser beam L is oscillated from the laser resonator 7 (7'). Then, a plurality of laser beams L is guided to the housing 5A via the light guiding means 8 including the plurality of optical fibers 21, condensed by the condensing lens 15, and then, after the direction of the laser beams L is changed to a vertical downward direction by the reflecting mirror 16, irradiated on the tool base 13. As explained above, since the plurality of optical fibers 21 are bundled in the matrix shape, when the laser beams L are irradiated on the tool base 13 from the respective optical fibers 21, irradiation spots of the laser beams L are also formed in the matrix shape (see FIGS. 2 and 3).

Note that, as shown in FIG. 3, in order to prevent the laser beams L from scattering using the through-hole 12A of the tool base 13, irradiation spots are not formed around the through-hole 12A. Therefore, the laser resonators 7' connected to the four optical fibers 21 in the center in FIG. 2 are controlled not to oscillate the laser beam L.

The linear groove 12B of the connection passage 29 is attracted by the vacuum source 32, the linear groove 12B is arranged in the middle of the laser beams L in adjacent two rows. Moreover, as shown in FIG. 4, a profile of the intensity of the laser beams L is in the Gaussian mode. Therefore, irrespective of the fact that the groove 12B is formed on the tool base 13, it is possible to minimize a loss of heat of the laser beams L due to the groove 12B.

When the laser beams L are transmitted through the tool base 13 including the transmitting members 11 and 12 in the two layers and irradiated on the bonding tool 14, the bonding tool 14 is heated by the laser beams L and the semiconductor chip 3 and bumps 35 (FIG. 1) arranged in a plurality of places of the lower surface of the semiconductor chip 3 are heated. Flux is applied to the rear surface of the semiconductor chip 3 in advance. The flux may be applied to a position of the substrate 2 where the semiconductor chip 3 is bonded.

When the bumps 35 melt, a part of the flux or the like adhering to the bumps 35 transpires and drifts in the periphery of the semiconductor chip 3. Then, the flux or the like is attracted into the chip attraction passage 23 by negative pressure. In this way, the flux or the like attracted into the chip attraction passage 23 also adheres to the connection passage 29 configuring the chip attraction passage 23 (the through-hole 12A and the groove 12B and the lower surface of the transmitting member 11 in a place where the through-hole 12A and the groove 12B are closed). However, the laser beams L in this embodiment are in the Gaussian mode as shown in FIG. 4. Moreover, the groove 12B is formed between the irradiation spots of the laser beams L adjacent to each other. Therefore, even if the flux or the like adheres to and solidifies on the inside of the groove 12B and on the lower surface of transmitting member 11 in the upper layer adjacent to the groove 12B, it is possible to prevent the heat efficiency of the laser beams L from being deteriorated. Therefore, it is possible to efficiently heat the semiconductor chip 3 with the bonding tool 14 and surely bond the semiconductor chip 3 to the substrate 2.

When the bonding operation ends in this way, the supply of the negative pressure from the vacuum source 32 to the chip attraction passage 23 is stopped according to a command from the control device. Therefore, the held state of the semiconductor chip 3 by the bonding tool 14 is released. Thereafter, the bonding head 5 is lifted by the lifting/lowering loading mechanism 6 and shifts to the next bonding.

As explained above, in this embodiment, even if the flux or the like transpires and adheres to and solidifies on the inside of the chip attraction passage 23, a setting area of the connection passage 29, which is a main part of the chip attraction passage 23, is small and the connection passage 29 is located between the irradiation spots of the laser beams L. Therefore, compared with the prior art, it is possible to prevent the heating efficiency of the laser beams L from being deteriorated by the transpired flux or the like. Further, since an area (the connection passage 29) contaminated by the flux or the like can be limited, it is possible to improve maintainability of the bonding device 1.

In this embodiment, since the irradiation spots of the laser beams L are arrayed in the matrix shape, it is easy to arrange the connection passage 29.

Since the beam profile of the irradiation spots of the laser beams L is in the Gaussian mode, the laser beams L having relatively low intensity is irradiated on the connection passage 29. Consequently, it is possible to suppress a fall in the transmittance of the laser beams L and prevent deterioration in the heating efficiency of the laser beams L.

Further, in this embodiment, since the tool base 13 is configured by laminating the transmitting members 11 and 12 in the two layers, it is possible to easily manufacture the connection passage 29. Moreover, by separating both the transmitting members 11 and 12, it is possible to easily clean the inside of the connection passage 29 to which the flux or the like adheres. Therefore, maintainability of the connection passage 29 is satisfactory.

In the embodiment explained above, the bonding tool 14 is heated by the laser beams L and the semiconductor chip 3 is heated by the heated bonding tool 14. However, it is also possible that the bonding tool 14 is omitted, the semiconductor chip 3 is attracted to and held on the tool base 13, and the semiconductor chip 3 is directly heated by the laser beams L.

In this case, the semiconductor chip 3 only has to be directly attracted to and held on the lower surface of the tool base 13 (the lower surface of the transmitting member 12) by stopping to attract the tool attraction passage 26 and, on the other hand, attracting the chip attraction passage 23. That is, in this case, the tool base 13 acts as the bonding tool 14.

In this way, the bonding device 1 in the embodiment explained above can heat the semiconductor chip 3 via the bonding tool 14 and directly heat the semiconductor chip 3 attracted to and held on the tool base 13 with the laser beams L transmitted through the tool base 13. However, naturally, the bonding device 1 can be configured as devices respectively exclusively used for heating the semiconductor chip 3 via the bonding tool 14 and directly heating the semiconductor chip 3 attracted to and held on the tool base 13.

In the embodiment, the groove 12B is formed on the upper surface of the transmitting member 12 in the lower layer. However, a linear groove may be formed in a place corresponding to the groove 12B on the lower surface of the transmitting member 11 in the upper layer.

In the embodiment, the tool base 13 is configured by laminating the transmitting member 11 in the upper layer and the transmitting member 12 in the lower layer. However, it is also possible that the tool base 13 is configured by a single transmitting member and the connection passage 29 having an L shape equivalent to the through-hole 12A and the inner space of the groove 12B is formed on the inside of the single transmitting member.

Further, it is also possible that the laser beam L is oscillated from the single laser resonator 7 and a plurality of laser beams are generated by a beam splitter or the like on the basis of the laser beam L.

It goes without saying that the present invention produces an effect against contamination due to, besides the flux explained above, a bonding material or a bonding auxiliary material having a characteristic that the material transpires because of heating during bonding, for example, an adhesive made of resin.

What is claimed is:

1. A bonding device comprising:
   a substrate stage on which a substrate is placed;
   a laser resonator configured to oscillate a laser beam;
   a bonding head configured to hold an electronic component and bond the electronic component to the substrate;
   light guiding means for guiding the laser beam oscillated from the laser resonator to the bonding head;
   a tool base provided in the bonding head and configured to transmit the laser beam; and
   a attraction passage for the electronic component provided on the tool base,
   the bonding device heating the electronic component with the laser beam transmitted through the tool base and bonding the electronic component to the substrate, wherein
   the light guiding means guides a plurality of laser beams respectively having different light guide paths to the bonding head and transmits the laser beams through the base, and
   the attraction passage for the electronic component has a section crossing an irradiating direction of the respective laser beams, the crossing section being arranged between the light guide paths of the respective laser beams.

2. The bonding device according to claim 1, wherein the light guiding means guides the respective laser beams to form a plurality of irradiation spots arrayed in a pattern of a matrix shape on an end face of the tool base.

3. The bonding device according to claim 1, wherein a beam profile of each of the respective laser beams guided to the bonding head by the light guiding means is in a Gaussian mode.

4. The bonding device according to claim 1, wherein
   the tool base is configured by laminating a first transmitting member on an upper layer side and a second transmitting member on a lower layer side, and
   the attraction passage is configured by an axis direction hole formed in the second transmitting member and a groove communicating with the axis direction hole and formed in at least one of contact surfaces of the first transmitting member and the second transmitting member.

* * * * *